US010777296B2

(12) United States Patent
Chaiken et al.

(10) Patent No.: US 10,777,296 B2
(45) Date of Patent: Sep. 15, 2020

(54) INFORMATION HANDLING SYSTEM AND METHOD TO DYNAMICALLY DETECT AND RECOVER FROM THERMALLY INDUCED MEMORY FAILURES

(71) Applicant: DELL PRODUCTS L.P., Round Rock, TX (US)

(72) Inventors: Craig L. Chaiken, Pflugerville, TX (US); Michael W. Arms, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 50 days.

(21) Appl. No.: 16/270,974

(22) Filed: Feb. 8, 2019

(65) Prior Publication Data
US 2020/0258591 A1    Aug. 13, 2020

(51) Int. Cl.
*G11C 29/50*      (2006.01)

(52) U.S. Cl.
CPC .................................. *G11C 29/50* (2013.01)

(58) Field of Classification Search
CPC ......... G11C 29/08; G11C 29/50; G11C 29/52; G06F 11/2289; G06F 13/1668
See application file for complete search history.

(56) References Cited

U.S. PATENT DOCUMENTS

| | | | |
|---|---|---|---|
| 7,260,007 B2* | 8/2007 | Jain | G01K 7/425 365/211 |
| 7,400,945 B2* | 7/2008 | Radhakrishnan | G06F 13/1668 700/108 |
| 9,576,682 B2* | 2/2017 | Chinnakkonda Vidyapoornachary | G11C 29/50 |
| 2011/0276845 A1* | 11/2011 | Depew | G11C 29/50 714/718 |
| 2012/0191964 A1* | 7/2012 | Lee | G06F 11/2289 713/2 |

(Continued)

OTHER PUBLICATIONS

Wikipedia, "Memory Reference Code" obtained from Internet Jun. 12, 2018, 2 pgs.

(Continued)

*Primary Examiner* — Shelly A Chase
(74) *Attorney, Agent, or Firm* — Egan Peterman Enders Huston

(57) ABSTRACT

Embodiments of information handling systems (IHSs) and methods are provided herein to dynamically detect and recover from thermally induced memory failures. Some embodiments include receiving an interrupt corresponding to a memory failure, detecting a current temperature of one or more memory components, and performing a series of memory tests on a specific block of memory within the memory components if the current temperature exceeds a maximum operating temperature specified for the memory components. Some embodiments include storing original contents of the specific block of memory within another memory component of the IHS, performing a first memory test on the specific block of memory at the current temperature, subsequently performing a second memory test on the specific block of memory at a temperature significantly lower than the current temperature, and determining that the memory failure is a thermally induced memory failure if the first memory test fails and the second memory test passes.

20 Claims, 2 Drawing Sheets

(56) References Cited

U.S. PATENT DOCUMENTS

2017/0273224 A1\* 9/2017 Shabbir ................. G05B 15/02

OTHER PUBLICATIONS

Wikipedia, "Blue Screen of Death", obtained from Internet Aug. 23, 2018, 4 pages.
Wikipedia, "Memory Controller", obtained from Internet Aug. 13, 2018, 5 pages.
Chaiken et al., "Systems and Methods for Creating and/or Modifying Memory Configuration Settings", U.S. Appl. No. 16/116,002, filed Aug. 29, 2018, 42 pgs.
Grobelney et al., "Systems and Methods for Control Flow Integrity in System Management Mode (SMM)", U.S. Appl. No. 16/182,192, filed Nov. 26, 2018, 26 pgs.

\* cited by examiner

INFORMATION HANDLING SYSTEM AND METHOD TO DYNAMICALLY DETECT AND RECOVER FROM THERMALLY INDUCED MEMORY FAILURES

FIELD

This invention relates generally to information handling systems (IHSs), and more particularly, to IHS software and hardware components and related methods to detect and recover from thermally induced memory failures.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (IHSs) typically include various types of computer readable memory, such as read only memory (ROM), random access memory (RAM), Flash memory, etc. In some cases, for example, an IHS may include system memory for storing program instructions and/or data, which is accessible and executable by host processor of the IHS. In some cases, the system memory may include a plurality of dual in-line memory modules (DIMMs), each containing one or more RAM modules mounted onto an integrated circuit board.

When an information handling system initially powered on or rebooted, the host processor runs memory reference code (MRC), as part of the basic input/output system (BIOS) code, to initialize memory components of the IHS (including system memory and other memory components) during power-on-self-test (POST). The MRC includes memory configuration setting information (such as timing, driving voltage, etc.), which is configured by the MRC during the IHS boot process, and used to access the memory components during operating system (OS) runtime. When an IHS is initially powered on or rebooted, the MRC runs a margining test routine at the existing boot temperature to determine a single set of memory configuration settings for a memory component, which are stored and subsequently used to access the memory component.

During a MRC margining test routine, memory timing (frequency) is increased while writing/reading to/from the memory component, until an upper margin frequency value is reached where an error occurs that causes the memory to fail. The memory timing is also decreased while writing/reading to/from the memory component, until a lower margin frequency value is reached where an error occurs that causes the memory to fail. A memory timing value is selected as the median timing frequency value between the upper and lower margin frequency values and stored in the MRC configuration settings. A memory drive voltage value is likewise selected as the median memory drive voltage value between similarly determined upper and lower margin drive voltage values, and stored in the MRC configuration settings. The selected values of memory timing and memory drive voltage are typically saved in non-volatile memory (such as, e.g., serial peripheral interface, SPI, Flash memory) for future use by the information handling system.

The MRC margining test routine is typically run early in the boot process while the memory temperature, and the temperature inside the information handling system chassis, remains near room temperature (e.g., near approximately 20-25° C.). During OS runtime, however, the temperature of (and surrounding) the memory component may increase or decrease by a significant amount. In some cases, a thermally induced memory failure may occur on a memory component when an operating temperature of the memory component causes the memory voltage/timing requirements needed to successfully access the memory component to exceed (or fall below) the MRC memory configuration settings, which were specified for the memory component during the most recent IHS boot process. Unlike other types of memory failure, a thermally induced memory failure is a temporary (i.e., non-permanent) memory failure that occurs on an otherwise "good" memory component.

Thermally induced memory failures are a common cause for information handling system failures that often cannot be duplicated when the memory component is returned to the service center for repair. This makes it difficult to identify the cause of a system failure and which parts of the system may be faulty. In some cases, a failed memory component may be returned to the end user, or sent to another end user, if the memory failure couldn't be duplicated by the service center. This could result in an end user experiencing repeated memory failures.

Some information handling systems include a software algorithm that functions to detect memory failures, including thermally induced memory failures and other types of memory failures. One example is the Reliable Memory Technology (RMT) algorithm provided on many Dell information handling systems. When any type of memory failure is detected, the RMT algorithm permanently blocks out areas of the memory component that are deemed to be "bad" by writing the bad memory ranges to another memory component of the IHS. If a thermally induced memory failure occurs on an RMT enabled system, an otherwise "good" memory component may have regions that are permanently disabled.

SUMMARY OF THE INVENTION

The following description of various embodiments of information handling systems and related methods is not to be construed in any way as limiting the subject matter of the appended claims.

According to various embodiments of the present disclosure, information handling systems (IHSs) and methods are provided herein to dynamically detect and recover from thermally induced memory failures on one or more memory components included within an IHS. In addition to automatically detecting and recovering from thermally induced memory failures, embodiments of the system and method disclosed herein reduce or eliminate repair costs and customer down time, and avoid permanently disabling areas of "good" memory components that encounter only temporary, thermally induced memory failures.

Although various embodiments are described herein in the context of detecting and recovering from thermally induced memory failures on system memory, and more specifically, on one or more dual in-line memory modules (DIMMs), the disclosed embodiments are not strictly limited to such and may alternatively include, or be performed on, substantially any suitable computer readable memory and/or memory technology. As such, the present disclosure is considered to encompass all such embodiments.

According to one embodiment, an information handling system (IHS) is provided herein including one or more memory components, a temperature sensor coupled to detect a temperature of the one or more memory components, a memory controller coupled to the one or more memory components, and at least one processing device coupled to the temperature sensor and the memory controller. The memory controller is configured to generate an interrupt corresponding to a memory failure, if an error is detected during a read operation conducted on at least one of the memory components. Upon receiving the interrupt from the memory controller, the at least one processing device is configured to execute program instructions to receive a current temperature from the temperature sensor and perform a series of memory tests on a specific block of memory within the one or more memory components, if the current temperature exceeds a maximum operating temperature specified for the one or more memory components.

The at least one processing device may be a host processor, an embedded controller (EC) or another processing device of the IHS. The at least one processing device may be generally configured to execute the program instructions to determine if the memory failure is a thermally induced memory failure, and to automatically recover from the thermally induced failure if a thermally induced memory failure is detected. Various method steps performed by the at least one processing device, via execution of the program instructions, are discussed in the method below.

According to one embodiment, a method is provided herein to dynamically detect and recover from thermally induced memory failures that occur on one or more memory components an information handling system (IHS). In general, the method may include receiving an interrupt corresponding to a memory failure, detecting a current temperature of the one or more memory components, and performing a series of memory tests on a specific block of memory within the one or more memory components, if the current temperature exceeds a maximum operating temperature specified for the one or more memory components. More specifically, the method may include performing a first memory test on the specific block of memory at the current temperature, and subsequently performing a second memory test on the specific block of memory at a temperature, which is significantly lower than the current temperature. If the first memory test fails and the second memory test passes, the method determines that the memory failure is a thermally induced memory failure.

In one example embodiment, the first memory test and the second memory test may each include repeatedly writing and reading a string of 1's and/or a string of 0's to and from the specific block of memory, and determining that the first/second memory test is successful, if all bits written into the specific block of memory are identical to the bits read out of the specific block of memory.

In some embodiments, if the first memory test fails, the method may include turning on one or more fans of the IHS, or running the one or more fans at a maximum speed, to significantly reduce the temperature of the one or more memory components before performing the second memory test. In one example embodiment, the one or more fans may be turned on, or run at the maximum speed, until the temperature of the one or more memory components decreases by a predetermined amount (e.g., by approximately 20° C.).

In some embodiments, additional method steps may be performed prior to performing the series of memory tests. Such additional method steps may include, for example, receiving a physical address of a memory location corresponding to the memory failure, using the physical address to locate a particular memory component experiencing the memory failure, and storing original contents of a block of memory surrounding the physical address within another memory component of the IHS. The block of memory may generally correspond to the specific block of memory on which the series of memory tests are conducted.

In some embodiments, additional method steps may be performed after performing the series of memory tests if the series of memory tests indicate that the memory failure is a thermally induced memory failure. In some embodiments, for example, the method may restore the original contents back to the specific block of memory, and may reduce a temperature at which one or more fans of the IHS are run at a maximum speed to reduce or prevent the occurrence of subsequent thermally induced memory failures. This enables the disclosed method to provide a non-destructive method for detecting and recovering from thermally induced memory failures.

In some embodiments, the method may further include logging the memory failure as a thermally induced memory failure. In some embodiments, said logging may include writing an error to a boot firmware event log. In some embodiments, said logging may additionally or alternatively include creating or updating a thermal failure count value stored in a non-volatile memory component of the IHS. In some if these embodiments, the method may further include increasing the thermal failure count value each time a subsequent thermally induced memory failure is detected by the method, and reducing a temperature at which one or more fans of the IHS are run at a maximum speed based on the thermal failure count value.

BRIEF DESCRIPTION OF THE DRAWINGS

Other advantages of the present disclosure will become apparent upon reading the following detailed description and upon reference to the accompanying drawings in which.

Figure 1:
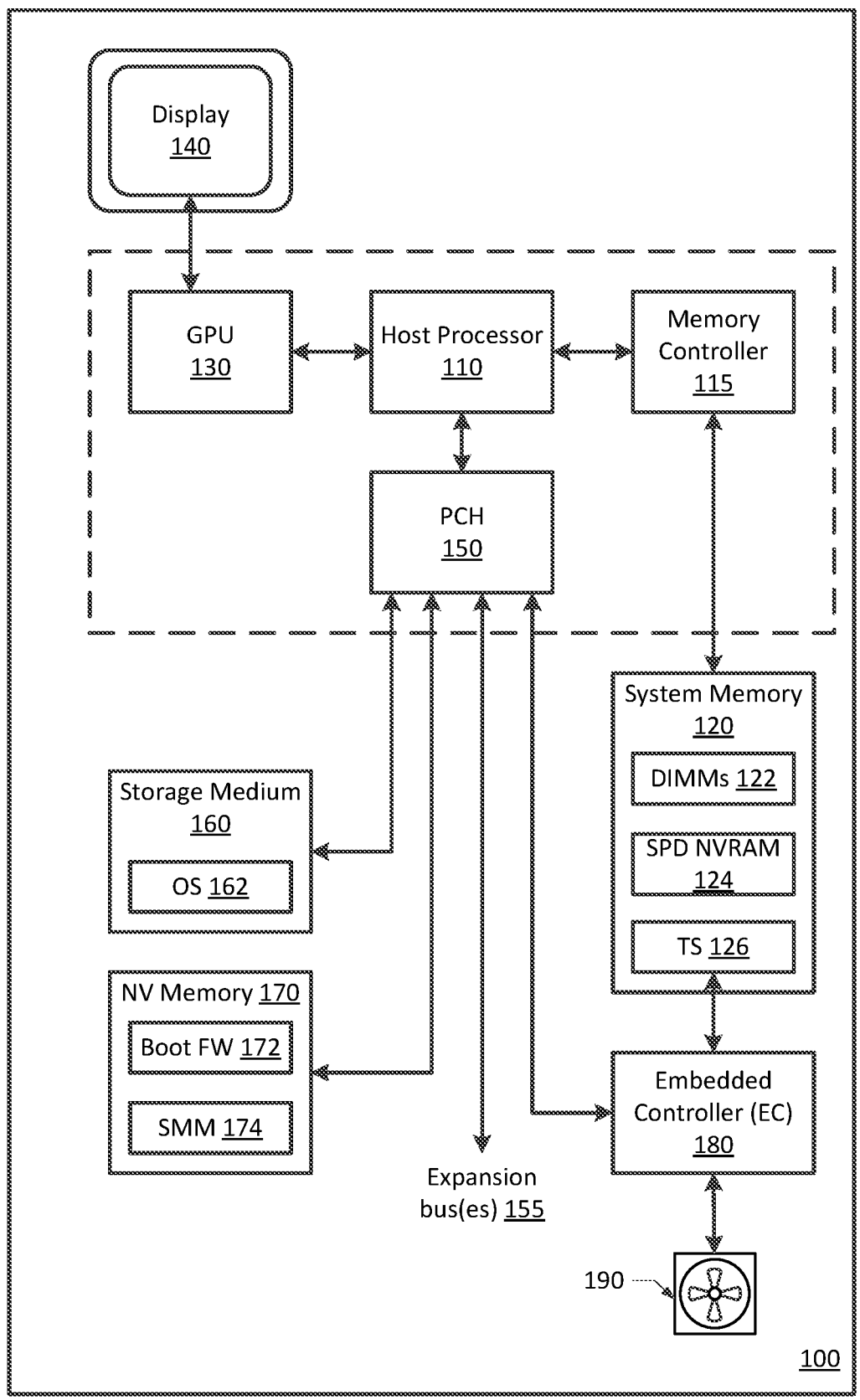
FIG. 1 is a block diagram illustrating one embodiment of an information handling system (IHS) in accordance with the present disclosure.

While the present disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the present disclosure is to cover all modifications, equivalents and alternatives falling within the spirit and scope of the present disclosure as defined by the appended claims.

DESCRIPTION OF ILLUSTRATIVE EMBODIMENTS

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may generally include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

FIG. 1 is a block diagram of an information handling system 100 (e.g., a desktop computer, laptop computer, tablet computer, MP3 player, personal data assistant (PDA), cell phone, etc.) as it may be configured according to one embodiment of the present disclosure. It is expressly noted, however, that the IHS configuration shown in FIG. 1 is exemplary only, and that the disclosed methods may be implemented on any type and/or configuration of information handling system having a computer readable memory that includes some form of error detection technology, such as error correcting code (ECC). Examples of computer readable memory suitable for use in the present disclosure include, but are not limited to, RAM, SRAM, DRAM, NVRAM, NVDIMM (a hybrid between RAM and NVRAM), erasable programmable ROM (EPROM), electrically erasable programmable ROM (EEPROM), and Flash memory. It will be further understood that while certain components of the information handling system are shown in FIG. 1 for illustrating embodiments of the present disclosure, the information handling system disclosed herein is not restricted to including only those components shown in FIG. 1 and described below.

In the exemplary embodiment shown in FIG. 1, information handling system (IHS) 100 includes host processor 110, memory controller 115, system memory 120, graphics processor unit (GPU) 130, display device 140, platform controller hub (PCH) 150, expansion bus(es) 155, computer readable storage medium 160, computer readable non-volatile (NV) memory 170, embedded controller (EC) 180 and fan(s) 190. In the illustrated embodiment, host processor 110 is a silicon-on-chip (SoC) processing device having an integrated memory controller 115, GPU 130 and PCH 150. It is noted, however, that host processor 110 is not restricted to an SoC implementation. In other embodiments, host processor 110 may be coupled to memory controller 115, GPU 130 and PCH 150 via a northbridge controller (not shown).

Host processor 110 may include various types of programmable integrated circuits (e.g., a processor such as a controller, microcontroller, microprocessor, ASIC, etc.) and programmable logic devices (such as a field programmable gate array "FPGA", complex programmable logic device "CPLD", etc.). According to one embodiment, host processor 110 may include at least one central processing unit (CPU) having one or more processing cores. The CPU may include any type of processing device, such as an Intel Pentium series processor, an Advanced Micro Devices (AMD) processor or another processing device. In some embodiments, host processor 110 may include other types of processing devices including, but not limited to, a graphics-derivative processor (such as a physics/gaming processor), a digital signal processor (DSP), etc.

GPU 130 is coupled to host processor 110 and configured to coordinate communication between the host processor and one or more display components of the IHS. In the embodiment shown in FIG. 1, GPU 130 is coupled to display device 140 to provide visual images to the user. Display device 140 may be a display screen embedded within the chassis of the IHS, or an external display screen or monitor coupled to the IHS. In some embodiments, GPU 130 may be further coupled to one or more display ports to support additional display functions. Although GPU 130 is illustrated as being integrated with host processor 110 in an SoC implementation, GPU 130 may be alternatively implemented as a separate integrated circuit chip, which is coupled to host processor 110 via a bus, in other embodiments.

System memory 120 may be generally configured to store program instructions and/or data, which is accessible and executable by host processor 110. System memory 120 may be implemented using any suitable memory technology, including but not limited to, random access memory (RAM), static RAM (SRAM), dynamic RAM (DRAM), synchronous dynamic RAM (SDRAM), non-volatile RAM (NVRAM), erasable programmable ROM (EPROM), electrically erasable programmable ROM (EEPROM), Flash memory, or any other type of volatile memory.

In the exemplary embodiment shown in FIG. 1, system memory 120 includes one or more dual in-line memory modules (DIMMs) 122, each containing one or more RAM modules mounted onto an integrated circuit board. Each DIMM may also include a serial presence detect (SPD) NVRAM 124 containing memory configuration settings (e.g., memory timing, drive voltage, etc.) for configuring the memory controller, and one or more temperature sensors 126 for detecting a temperature of the DIMMs 122. According to one embodiment, DIMMs 122 may be implemented as error correcting code (ECC) memory, and therefore, may have extra data bits that are used by memory controller 115 to detect and correct errors. When implemented as ECC DIMMs 122, memory controller 115 may be configured to detect and correct single-bit errors (i.e., an ECC correctable error), and detect but not correct errors of 2 bits per 64-bit word (i.e., an ECC uncorrectable error).

Memory controller 115 is coupled between host processor 110 and system memory 120 and configured to manage the flow of data there between. Although memory controller 115 is illustrated as being integrated with host processor 110 in an SoC implementation, memory controller 115 may be alternatively implemented as a separate integrated circuit chip, which is coupled between the host processor and system memory in one embodiments. For example, memory controller 115 may be provided within a memory controller hub, which is coupled between host processor 110 and system memory 120.

Figure 2:
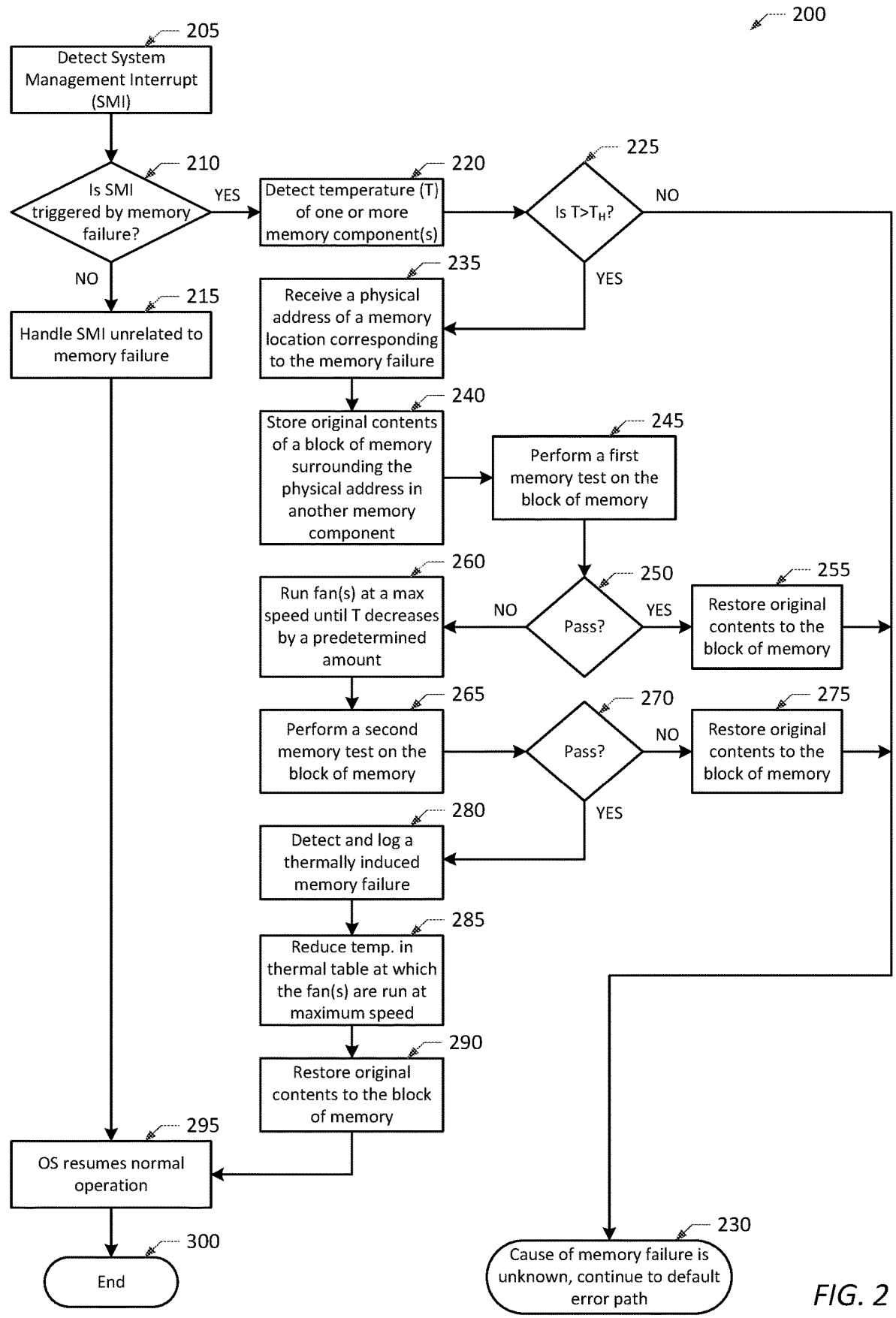
FIG. 2 is a flowchart diagram illustrating one embodiment of a method to dynamically detect and recover from thermally induced memory failures.

In the exemplary embodiment shown in FIG. 1, memory controller 115 is configured to manage the flow of data between host processor 110 and system memory 120 according to the memory configuration settings (e.g., memory timing, driving voltage, etc.) stored within SPD NVRAM 124. For example, memory controller 115 may be configured to conduct read operations from, and write operations to, system memory 120 on behalf of host processor 110 using the stored memory configuration settings. According to one embodiment, memory controller 115 may be configured to check the integrity of data read from system memory 120 during each read operation performed by host processor 110 (or another IHS component). For example, memory controller 115 may perform an error correction code (ECC) check on the data read from system memory 120 during each read operation, and may generate a system management interrupt (SMI), if the ECC check indicates that a memory failure has occurred. If an SMI is triggered by memory controller 115, an SMI handler may be invoked to determine if the memory failure is a thermally induced memory failure or another type of memory failure. FIG. 2 illustrates exemplary method steps that may be performed by an SMI handler to detect and recover from thermally induced memory failures.

PCH 150 is coupled to host processor 110 and configured to handle input/output (I/O) operations for the IHS. In some embodiments, PCH 150 may be connected to host processor 110 via a direct media interface (DMI), and may include a plurality of different communication interfaces and ports for communicating with various system components, such as expansion bus(es) 155, computer readable storage medium 160, computer readable non-volatile (NV) memory 170, and embedded controller (EC) 180, in addition to other IHS not explicitly shown and described herein.

Examples of communication interfaces and ports that may be included within PCH 150 include, but are not limited to, a Peripheral Component Interconnect (PCI) interface, a PCI-Express (PCIe) interface, a Serial Peripheral Interface (SPI), an Enhanced SPI (eSPI), a Serial AT Attachment (SATA) interface, a Low Pin Count (LPC) interface, a Small Computer Serial Interface (SCSI), an Industry Standard Architecture (ISA) interface, an Inter-Integrated Circuit (I²C) interface, a Universal Serial Bus (USB) interface and a Thunderbolt™ interface. Examples of expansion bus(es) 155 that may be coupled to PCH 150 include, but are not limited to, a PCI bus, a PCIe bus, a SATA bus, a USB bus, etc.

Computer readable storage medium 160 may include any type of persistent, non-transitory computer readable storage medium, such as one or more hard disk drives (HDDs) or solid-state drives (SSDs), and may be generally configured to store software and/or data. In some embodiments, computer readable storage medium 160 may be configured to store an operating system (OS) 162 for the IHS, in addition to one or more user applications and data. OS 162 may generally contain program instructions (or computer program code), which may be executed by host processor 110 to perform various tasks and functions for the information handling system and/or for the user.

Computer readable NV memory 170 may include any type of non-volatile memory including, but not limited to, read-only memory (ROM), non-volatile random access memory (NVRAM) and Flash memory, and may be generally configured to store software and/or firmware modules.

The software and/or firmware modules stored within computer readable NV memory 170 may generally contain program instructions (or computer program code), which may be executed by host processor 110 to instruct components of IHS 100 to perform various tasks and functions for the information handling system. As shown in FIG. 1, NV memory 170 may generally include boot firmware (FW) 172 and system management mode (SMM) code 174, in addition to other software and/or firmware modules.

Boot firmware 172 includes software and/or firmware modules for specifying hardware configuration settings, system date/time and boot sequence, etc. In some embodiments, boot firmware 172 may be implemented as a Basic Input/Output System (BIOS) and/or a Unified Extensible Firmware Interface (UEFI). When IHS 100 is initially powered on or rebooted, program instructions within boot firmware 172 may be executed by host processor 110 to configure hardware components of the IHS, perform a Power-On Self-Test (POST) to ensure the hardware configuration is valid and working properly, discover and initialize devices and launch a bootloader to load OS 162. Once launched, the bootloader within boot firmware 172 may retrieve OS 162 from computer readable storage medium 160 and load it into system memory 120.

As known in the art, boot firmware 172 may include boot services and runtime services. Boot services are available for execution only when boot firmware 172 owns the platform during the pre-boot phase of the boot firmware before the OS is loaded and running. Runtime services, on the other hand, are available for execution while the OS is running (i.e., during OS runtime). Initializing memory components is one example of a boot service provided within boot firmware 172. Examples of runtime services typically provided within boot firmware 172 include, but are not limited to, date/time configuration settings and access to memory components.

According to one embodiment, boot firmware 172 includes memory reference code (MRC), which may be executed by host processor 110 as a boot service. As noted above, MRC is responsible for initializing system memory (such as DIMMs 122) during power-on-self-test (POST). In some systems, the MRC may select a single set of memory configuration settings (e.g., memory timing, driving voltage, etc.) when the information handling system is initially booted (e.g., during the boot phase), and may store the selected settings in non-volatile memory (e.g., NV memory 170) for future use. During OS runtime, memory controller 115 uses the memory configuration settings, which were previously selected and stored by the MRC during the boot phase, to access system memory 120.

SMM code 174 includes software and/or firmware modules for handling system events (like memory or chipset errors), managing system safety (such as, e.g., turning system fans on/off and shutting down the system when high CPU temperatures are detected), and performing other power management and control operations. The system management mode (SMM) is entered via a system management interrupt (SMI), which can be triggered by a hardware interrupt (e.g., via assertion of an interrupt pin of the host processor chip), or by a software interrupt via execution of an instruction (e.g., an instruction that writes an I/O port or address range that is recognized by the system as making a request to trigger an SMI).

SMM code 174 includes SMI functions and SMI handlers. Upon system startup, the SMI functions stored within SMM code 174 may be loaded into a region of system memory 120 during the normal boot process. During OS runtime, an SMI handler may be invoked in response to an SMI to fetch SMI function(s) corresponding to the SMI from system memory 120. Once loaded into system memory, the SMI functions may be executed by host processor 110 to handle the SMI.

According to one embodiment, memory controller 115 may generate an SMI if an ECC check performed by the memory controller on data read from system memory 120 indicates that a memory failure has occurred. Once an SMI is generated, an SMI handler may be invoked to load a corresponding SMI function stored within the SMM code region of system memory 120 into host processor 110. As described in more detail below, the SMI function may be executed by host processor 110 to determine if the memory failure is a thermally induced memory failure. If a thermally induced memory failure is detected, the SMI function may be executed by host processor 110 to recover from the thermally induced memory failure.

Embedded controller (EC) 180 is coupled to PCH 150 and may be configured to perform functions such as power/thermal system management, etc. EC 180 may also be configured to execute program instructions to boot information handling system 100, load firmware from NV memory 170 into system memory 120 and/or EC 180, launch the firmware, etc. In one example, EC 180 may include a processing device for executing program instructions to perform the above stated functions. Although not strictly limited to such, the processing device of EC 180 may be implemented as a programmable integrated circuit (e.g., a controller, microcontroller, microprocessor, ASIC, etc.) or as a programmable logic device "PLD" (such as field programmable gate array "FPGA", complex programmable logic device "CPLD", etc.).

In the exemplary embodiment shown in FIG. 1, EC 180 is coupled to read a real-time temperature of system memory 120 via the temperature sensor(s) 126 provided on the system memory (e.g., thermistor placed on or near memory components of system memory 120), and coupled to provide the real-time temperature, via PCH 150 and a EC Mailbox Interface, to a runtime service of the boot firmware 172 executing on host processor 110. One or more fan(s) 190 are provided within the IHS to circulate cooling air through the chassis enclosure of information handling system 100. In the embodiment shown in FIG. 1, fan(s) 190 are controlled by signals provided by EC 180. In some embodiments, fans 190 may include one or more dedicated memory cooling fans, which are positioned to cool system memory 120 (e.g., DIMMs 122), and controlled separately by EC 180 based on real-time temperatures reported to EC 180 by temperature sensor(s) 126.

As noted above, host processor 110 executes memory reference code (MRC) during the IHS boot process to initialize memory components of the IHS (e.g., system memory 120) by performing an MRC margining test routine. During an MRC margining test routine, the MRC code selects and stores a single set of memory configuration settings (e.g., memory timing, driving voltage, etc.), which may be subsequently used by a memory controller (e.g., memory controller 115) to access the memory component during runtime. As such, the MRC determines a single set of memory configuration settings one time, very early in the boot process, at an arbitrary testing temperature without regard to actual operating temperatures of and/or surrounding the memory component. Because the MRC does not re-evaluate memory configuration settings during runtime, as operating temperatures of the memory component change, the stored MRC memory configuration settings are typically not ideal for all operating temperatures. As a result, memory operation may be less reliable, and in some cases unreliable, at relatively hot and cold temperatures that deviate significantly from the initial test temperature.

In some cases, a memory component (e.g., system memory 120) may encounter a failure when the MRC memory configuration settings determined during a given boot process are insufficient for the current operating environment. As operating temperatures increase well beyond the boot temperature, for example, relatively higher drive voltages and relatively lower timing frequencies may be needed to successfully access the memory component. On the other hand, relatively lower drive voltages and relatively higher timing frequencies may be needed to successfully access the memory component when operating temperatures decrease significantly below the boot temperature.

As noted above, a thermally induced memory failure may occur when an operating temperature of a memory component causes the memory voltage/timing requirements needed to successfully access the memory component to exceed (or fall below) the MRC memory configuration settings, which were selected for the memory component and stored during the most recent IHS boot process. Unlike other types of memory failure, a thermally induced memory failure is a temporary (i.e., non-permanent) memory failure that occurs on an otherwise "good" memory component.

In the past, thermally induced memory failures were addressed in one of several ways. If a thermally induced memory failure was detected during development, (a) the thermal tables for the system fans (e.g., fans 190) may be modified to decrease the temperature at which the fans are operated at maximum speed, (b) the MRC may be configured to select more conservative memory configuration settings during the boot process, or (c) the memory component may be throttled during runtime to keep it running cooler. These methods may be acceptable during product development, since the failing memory components are available and quick BIOS updates are possible. Once memory failures are encountered in the field, however, acquiring a failing memory component and reproducing the memory failure outside of the end user's system are very challenging.

If a thermally induced memory failure was detected after development, the end user was often required to send the failed memory component (or the IHS containing the failed memory component) back to the manufacturer or service center for testing, repair and/or replacement. Unfortunately, returning failed memory components result in end user down time and costs associated with repair and/or replacement of the failed memory component. When a failed memory component is returned, it is often difficult for the service center to duplicate the memory failure, and therefore, difficult to determine the exact cause of the memory failure and the reason for the return. In some cases, a failed memory component may be returned to the end user, or sent to another end user, if the memory failure couldn't be duplicated by the service center. This could result in an end user experiencing repeated memory failures.

As noted above, some information handling systems include a software algorithm that functions to detect memory failures and permanently map out or block failed areas of a memory component that are determined to be "bad" by writing the bad memory ranges to another memory component (such as, e.g., SPD NVRAM 124) of the IHS. One example of such an algorithm is the Reliable Memory Technology (RMT) algorithm, which is provided on many Dell information handling systems and used to detect memory failures, including thermally induced memory failures and other, more permanent types of memory failures. The RMT algorithm is typically executed when uncorrectable memory errors are encountered, or when a predefined number of correctable memory errors is encountered. The RMT algorithm, however, does not differentiate thermally induced memory failures from other types of memory failures, and therefore, cannot determine if the memory failure is temporary (e.g., thermally induced) or permanent. If a thermally induced memory failure occurs on an RMT enabled system, an otherwise "good" memory component may have regions that are permanently disabled by the RMT algorithm.

To overcome these disadvantages, the present disclosure provides an improved system and method to dynamically detect and recover from thermally induced memory failures that occur within one or more memory components of an IHS. Unlike conventional solutions for addressing thermally induced memory failures, the improved method disclosed herein is performed automatically by hardware and software components of the information handling system. As such, the improved method requires no interaction on the end user's part (i.e., does not require the user to return the system to the service center) and reduces end user down time and costs associated with service repair and/or replacement. In addition, the improved method is performed dynamically (i.e., in real-time) in response to any type of memory failure before the RMT algorithm is executed by the host processor. This ensures that the disclosed method is performed in the operating environment in which the memory failure occurred (which increases the likelihood of duplicating and detecting a thermally induced memory failure), and prevents the RMT algorithm from permanently disabling "failed" memory blocks when a thermally induced memory failure is detected. Furthermore, the improved method eliminates the need for releasing a new BIOS update with a different thermal table when thermally induced memory failures are detected.

FIG. 2 is a flowchart diagram illustrating one embodiment of a method 200 that may be used by an information handling system (IHS) to dynamically detect and recover from thermally induced memory failures that occur on one or more memory components of the IHS (e.g., system memory 120, NV memory 170 or another memory component of the IHS). In general, method 200 may be performed by at least one processing device of the IHS (e.g., host processor 110, EC 180 and/or another processing device) executing program instructions during OS runtime.

According to one embodiment, method 200 may be performed by a host processor of an IHS (e.g., host processor 110) executing system management interrupt (SMI) functions, which are provided to the host processor by an SMI handler. The SMI handler may be invoked in response to a system management interrupt (SMI), which is generated by a memory controller of the IHS (e.g., memory controller 115) upon detecting a memory failure. According to one embodiment, the memory controller may detect a memory failure by detecting an error correcting code (ECC) error during a read operation performed on the one or more memory components.

Although method 200 is described in the context of a host processor executing program instructions (e.g., SMI functions), method 200 may be alternatively performed by another IHS processing device (e.g., EC 180 or another processing device) executing other program instructions. As such, the method shown in FIG. 2 represents a computer implemented method, which is performed by hardware, software and/or firmware components of an information handling system. The computer implemented method shown in FIG. 2 and disclosed herein improves how the information handling system functions, in at least some respects, by enabling the IHS to dynamically detect and recover from thermally induced memory failures. In doing so, the computer implemented method detects thermally induced memory failures, differentiates thermally induced memory failures from other types of (more permanent) memory failures, and prevents "failed" memory blocks from being permanently disabled when a thermally induced memory failure is detected.

According to one embodiment, method 200 may begin by detecting a system management interrupt (SMI) (in step 205) and determining if the SMI was triggered by a memory failure (in step 210). As noted above, there are numerous ways and reasons for triggering an SMI. If the SMI detected in step 205 is not related to, or not triggered by, a memory failure (NO branch of step 210), an SMI handler corresponding to the SMI is invoked to load corresponding SMI functions into the host processor for execution. Once the SMI functions are executed and the SMI unrelated to memory failure is handled (in step 215), the operating system (OS) executing on the host processor may resume normal operation (in step 295) and the method may end (in step 300).

In some cases, an SMI may be triggered by a memory failure detected on a memory component of the IHS. As noted above, a memory controller of the IHS (e.g., memory controller 115) may detect a memory failure and trigger an SMI, if an ECC error is generated by the memory controller during a read operation conducted on a memory component. If the method shown in FIG. 2 determines that the SMI detected in step 205 was triggered by a memory failure (YES branch of step 210), an SMI handler corresponding to the memory failure SMI is invoked to load corresponding SMI function(s) into the host processor for execution. Method steps 220-290 represent various program instructions that may be included within the SMI function(s) and executed by the host processor to determine if the memory failure is a thermally induced memory failure, and if so, to recover from the thermally induced memory failure.

In step 220, a temperature (T) of one or more memory components included within the IHS is detected. In one embodiment, the method may detect a real-time temperature (T) of system memory 120 via the temperature sensor(s) 126 provided on the system memory (e.g., thermistor(s) placed on or near one or more memory components of system memory 120, such as DIMMs 122). In step 225, the method determines if the temperature (T) detected in step 220 is greater than a relatively high temperature ($T_H$). The relatively high temperature ($T_H$) is predetermined, and in one embodiment, may be a maximum operating temperature specified for the memory component. If the method determines that $T<T_H$ (NO branch of step 225), the method determines that the cause of the memory failure is unknown, and continues to a default error path (in step 230). In one example embodiment, the host processor may execute an RMT algorithm (in step 230) to permanently disable "bad" areas of the memory component.

If the method determines that $T>T_H$ (YES branch of step 225), the method may receive a physical address of a memory location corresponding to the memory failure (in step 235) from memory controller 115. In some embodiments, the method may use the physical address to locate the particular memory component experiencing the memory failure. For example, an IHS may include a plurality of memory components (e.g., a plurality of DIMMs 122, each having one or more memory modules mounted on a circuit board). In one embodiment, the method may use the physical address received in step 235 to locate the particular memory component (e.g., a particular DIMM 122 or a particular memory module thereon) corresponding to the memory failure.

After receiving the physical address in step 235, the original contents of a block of memory surrounding the physical address (i.e., a block of memory containing the failed memory) are stored in another memory component of the IHS (such as, e.g., a RAM buffer in SMM memory) (in step 240), and a first memory test is conducted on the memory block (in step 245). In one embodiment, the first memory test performed in step 245 may be a stressful (i.e., destructive) memory test, which involves repeatedly writing/reading a string of 1's and/or a string of 0's to/from the memory locations in the memory block. A successful or "passing" memory test is one in which all bits written into the memory block are identical to the bits read out of the memory block. If the first memory test passes (YES branch of step 250), the method restores the original contents back to the memory block (in step 255), determines that the cause of the memory failure is unknown and continues to the default error path (in step 230), as discussed above.

If the first memory test fails (NO branch of step 250), the method may turn on one or more fans (such as fans 190), and/or may run the system fan(s) at a maximum speed, until the temperature (T) of the affected memory component decreases by a predetermined amount (e.g., by approx. 20° C.) (in step 260). In step 265, the method conducts a second memory test on the memory block at the significantly lower temperature. If the second memory test fails (NO branch of step 270), the method restores the original contents back to the memory block (in step 275), determines that the cause of the memory failure is unknown and continues to the default error path (in step 230), as discussed above.

If the second memory test passes (YES branch of step 270), the method detects and (optionally) logs a thermally induced memory failure. In one embodiment, the method may log a thermally induced memory failure by writing an error to the boot firmware event log and/or by creating or updating a thermal failure count value stored in NVRAM. Each time a thermally induced failure is detected in step 280, the thermal failure count value may be incremented by 1.

In step 285, the method reduces the temperature (stored in the fan thermal table) at which the system fan(s) are run at maximum speed. In some embodiments, the boot firmware may read the thermal failure count value stored in NVRAM when the fan thermal table is initialized (e.g., during an IHS boot process), and may reduce the temperature stored in the fan thermal table (in step 285) based on the thermal failure count value. In one example embodiment, the temperature stored in the fan thermal table may be reduced (in step 285) every time the thermal failure count value is incremented. In another example embodiment, the temperature stored in the fan thermal table may be reduced (in step 285) when the thermal failure count value exceeds a certain value (e.g., 3). If the thermal failure count value exceeds the certain value, the maximum temperature before cooling or throttling might be reduced, for example, by 5 degrees Celsius. Once the temperature is reduced, or if the boot firmware detects a memory configuration change, the thermal count value may be reset to zero. After reducing the temperature (in step 285), the method restores the original contents back to the memory block (in step 290), the operating system (OS) executing on the host processor resumes normal operation (in step 295) and the method end (in step 300).

The method shown in FIG. 2 detects thermally induced memory failures by performing a first memory test on a "failed" memory block at a current temperature, performing a second memory test on the "failed" memory block at a temperature significantly lower than the current temperature, and detecting a thermally induced memory failure if the first memory test fails and the second memory test passes. By performing the first and second memory tests in response to an interrupt (e.g., an SMI) generated in response to a memory failure, the method described herein is able to easily detect thermally induced memory failures (since the first and second memory tests are performed in real-time in the environment in which the failure occurred), and distinguish thermally induced memory failures from other types of memory failures.

The method shown in FIG. 2 restores thermally induced memory failures by storing the original contents of the "failed" memory block in another memory component of the IHS (in step 240) prior to performing the first and second memory tests, and restoring the original contents back to the memory block (in step 290) after the memory tests are performed. In addition, the method shown in FIG. 2 reduces or prevents the occurrence of subsequent (or future) thermally induced memory failures by reducing the temperature stored in the fan thermal table (step 285), thereby enabling the system fan(s) to run at maximum speed at a lower temperature than was previously specified in the fan thermal table.

It will be understood that one or more of the tasks, functions, or methodologies described herein may be implemented, for example, as firmware or as a computer program of instructions embodied in a non-transitory tangible computer readable medium that is executed by a CPU, embedded controller, microcontroller, processor, microprocessor, FPGA, ASIC, or other suitable processing device.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method to detect thermally induced memory failures that occur on one or more memory components of an information handling system (IHS), wherein the method comprises:
   receiving an interrupt corresponding to a memory failure;
   detecting a current temperature of the one or more memory components; and
   performing a series of memory tests on a specific block of memory within the one or more memory components if the current temperature exceeds a maximum operating temperature specified for the one or more memory components:
   wherein said performing a series of memory tests comprises:
       performing a first memory test on the specific block of memory at the current temperature;

subsequently performing a second memory test on the specific block of memory at a temperature, which is significantly lower than the current temperature; and determining that the memory failure is a thermally induced memory failure if the first memory test fails and the second memory test passes.

2. The method as recited in claim 1, wherein prior to said performing a series of memory tests, the method further comprises:

receiving a physical address of a memory location corresponding to the memory failure;

using the physical address to locate a particular memory component experiencing the memory failure; and storing original contents of a block of memory surrounding the physical address within another memory component of the IHS, wherein the block of memory corresponds to the specific block of memory.

3. The method as recited in claim 2, wherein if the memory failure is determined to be a thermally induced memory failure, the method further comprises restoring the original contents back to the specific block of memory.

4. The method as recited in claim 1, wherein if the memory failure is determined to be a thermally induced memory failure, the method further comprises reducing a temperature at which one or more fans of the IHS are run at a maximum speed to reduce or prevent the occurrence of subsequent thermally induced memory failures.

5. The method as recited in claim 1, wherein said performing a first memory test and said subsequently performing a second memory test each comprise:

repeatedly writing and reading a string of 1's and/or a string of 0's to and from the specific block of memory; and determining that the first/second memory test is successful if all bits written into the specific block of memory are identical to the bits read out of the specific block of memory.

6. The method as recited in claim 1, further comprising determining that the memory failure is not a thermally induced memory failure if the first memory test passes or the second memory test fails.

7. The method as recited in claim 1, wherein if the first memory test fails, the method further comprises turning on one or more fans of the IHS, or running the one or more fans at a maximum speed, to significantly reduce the temperature of the one or more memory components before performing the second memory test.

8. The method as recited in claim 7, wherein the one or more fans are turned on or run at the maximum speed until the temperature of the one or more memory components decreases by a predetermined amount.

9. The method as recited in claim 1, wherein if the memory failure is determined to be a thermally induced memory failure, the method further comprises logging the memory failure as a thermally induced memory failure.

10. The method as recited in claim 9, wherein said logging comprises at least one of the following:

writing an error to a boot firmware event log; and creating or updating a thermal failure count value stored in a non-volatile memory component of the IHS.

11. The method as recited in claim 10, further comprising increasing the thermal failure count value each time a subsequent thermally induced memory failure is detected by the method.

12. The method as recited in claim 11, further comprising reducing a temperature at which one or more fans of the IHS are run at a maximum speed based on the thermal failure count value.

13. An information handling system, comprising:

one or more memory components;

a temperature sensor coupled to detect a temperature of the one or more memory components;

a memory controller coupled to the one or more memory components and configured to generate an interrupt corresponding to a memory failure if an error is detected during a read operation conducted on at least one of the memory components; and at least one processing device coupled to the temperature sensor and the memory controller, wherein upon receiving the interrupt from the memory controller, the at least one processing device is configured to execute program instructions to:

receive a current temperature from the temperature sensor; and perform a series of memory tests on a specific block of memory within the one or more memory components if the current temperature exceeds a maximum operating temperature specified for the one or more memory components.

14. The information handling system as recited in claim 13, wherein prior to performing the series of memory tests, the at least one processing device is further configured to execute program instructions to:

receive a physical address of a memory location corresponding to the memory failure;

use the physical address to locate a particular memory component experiencing the memory failure; and store original contents of a block of memory surrounding the physical address within another memory component of the IHS.

15. The information handling system as recited in claim 13, wherein to perform the series of memory tests, the at least one processing device is configured to execute program instructions to:

perform a first memory test on the specific block of memory at the current temperature;

subsequently perform a second memory test on the specific block of memory at a temperature significantly lower than the current temperature; and determine that the memory failure is a thermally induced memory failure if the first memory test fails and the second memory test passes.

16. The information handling system as recited in claim 15, wherein if the first memory test fails, the at least one processing device is configured to execute program instructions to turn on one or more fans of the IHS, or run the one or more fans at a maximum speed, to significantly reduce the temperature of the one or more memory components before performing the second memory test.

17. The information handling system as recited in claim 15, wherein if the memory failure is determined to be a thermally induced memory failure, the at least one processing device is further configured to execute program instructions to:

reduce a temperature at which one or more fans of the IHS are run at a maximum speed to reduce or prevent the occurrence of subsequent thermally induced memory failures; and restore original contents of the specific block of memory, which were stored within another memory component of the IHS prior to performing the series of memory tests, back to the specific block of memory.

18. The information handling system as recited in claim 15, wherein if the memory failure is determined to be a thermally induced memory failure, the at least one processing device is further configured to execute program instructions to:
 write an error to a boot firmware event log; and
 create or updating a thermal failure count value stored in a non-volatile memory component of the IHS.

19. The information handling system as recited in claim 18, wherein the at least one processing device is further configured to execute program instructions to increase the thermal failure count value each time a subsequent thermally induced memory failure is detected.

20. The information handling system as recited in claim 19, wherein the at least one processing device is further configured to execute program instructions to reduce a temperature at which one or more fans of the IHS are run at a maximum speed based on the thermal failure count value.

* * * * *